United States Patent
Khozyainov

(10) Patent No.: US 8,618,912 B2
(45) Date of Patent: Dec. 31, 2013

(54) SYSTEM FOR MONITORING DETACHABLE CONNECTIONS USING RFID TAGS

(75) Inventor: Boris Alekseevich Khozyainov, Korolev (RU)

(73) Assignee: Boris A. Khozyainov, Korolev (RU)

(\*) Notice: Subject to any disclaimer, the term of this patent is extended or adjusted under 35 U.S.C. 154(b) by 547 days.

(21) Appl. No.: 12/865,147

(22) PCT Filed: Jan. 23, 2009

(86) PCT No.: PCT/RU2009/000013
§ 371 (c)(1),
(2), (4) Date: Jul. 29, 2010

(87) PCT Pub. No.: WO2009/096814
PCT Pub. Date: Aug. 6, 2009

(65) Prior Publication Data
US 2011/0012712 A1  Jan. 20, 2011

(30) Foreign Application Priority Data

Jan. 31, 2008 (RU) ................................ 2008103047

(51) Int. Cl.
*G06K 7/01* (2006.01)
*G08B 21/00* (2006.01)

(52) U.S. Cl.
USPC ............................................ 340/10.1; 340/687

(58) Field of Classification Search
USPC ............ 340/686.1, 687, 686.2, 686.4, 693.6, 340/693.9, 10.1
See application file for complete search history.

(56) References Cited

U.S. PATENT DOCUMENTS 6,784,802 B1 \* 8/2004 Stanescu ....................... 340/687
7,306,489 B2 \* 12/2007 Werthman et al. ........ 439/620.01

\* cited by examiner

*Primary Examiner* — Jennifer Mehmood
*Assistant Examiner* — Yong Hang Jiang

(57) ABSTRACT

The invention relates to communication technology. Use of the invention allows to monitor detachable connections using one antenna for a group of ports. This technical result is achieved by steps of: a patch cord plug is provided with the sensor of connection which contains an RFID tag; a port is provided with the modulator which changes uniquely the reply signal of the RFID tag; the reply signal of the RFID tag changes perceived by an RFID interrogator is changed in an unique manner when the plug is connected to the port; the port and the plug connected to the port is identified using the changed reply signal of the RFID tag. The tag can contain a dry reed switch which is a part of the RFID tag antenna. The modulator can be an electromagnet.

20 Claims, 2 Drawing Sheets

SYSTEM FOR MONITORING DETACHABLE CONNECTIONS USING RFID TAGS

FIELD OF THE INVENTION

The present invention relates to different kinds of technology. The invention is intended mainly to the communication technology and can be used for monitoring connections of patch panels.

BACKGROUND OF THE INVENTION

There are many different means for cable systems monitoring in the world. The main purpose of the systems is to identify each of two parts of a detachable connection, for example, to identify the patch cord plug that is connected to the specific port of the patch panel.

For example, the U.S. Pat. No. 6,784,802 (31 Aug. 2004) and U.S. Pat. No. 7,170,393 (30 Jan. 2007) disclose the similar system based on RFID. Plugs of patch cords are provided with RFID tags. The first invention mentioned above uses antennas (sensors) of an RFID interrogator to read of the RFID tags. The antennas are mounted at every port of the patch panel. The second invention uses the grid of antennas connected to an RFID interrogator.

All two invention mentioned above require considerable alteration of patch panels. Every port of a patch panel has to be provided additionally with at least one antenna of RFID interrogator.

SUMMARY OF THE INVENTION

Thus, the object of the present invention consists in developing such means of monitoring detachable connections that allow to identify each part of a detachable connection using one antenna of an RFID interrogator for several detachable connections.

In order for achieving this technical result, it is proposed a system for monitoring detachable connections using RFID tags, which system comprising a plug provided with a connection sensor comprising a RFID tag which plug is the first part of a detachable connection; a group of ports consisting of at least two ports which ports is the second part of detachable connections where said plug is connected to; at least one RFID interrogator; the computer system which processes the information received from said interrogator identifying each part of a detachable connection; characterized in that each port of said group of ports has a modulator which changes the reply signal of said RFID tag perceived by said interrogator in an unique manner for each port of said group of ports after connecting said plug to any port of said group of ports; the reply signal of said RFID tag perceived by said interrogator is changed by said modulator; the said computer system identifies each part of the detachable connection using the reply signal of said RFID tag changed by said modulator.

In the proposed system the modulator can change the RSSI of the reply signal of said RFID tag using screening some time.

The modulator can change the identifier transmitted by said RFID tag or the memory content of the RFID tag perceived by said interrogator.

In some cases modulator changes the reply signal of the RFID tag in the time interval corresponded by the computer system with the port provided with said modulator.

The modulator can make the RFID tag available or unavailable to read by said interrogator.

The computer system controls states of the modulators.

In other cases RFID tag contains one or several switches controlled by magnetic field. The modulator can be a electromagnet and the computer system changes the power supply of said electromagnet.

On other hand modulator can change a physical property of the environment near the port where said modulator is mounted and said changing is unique within said group of ports. The physical property of the environment can be magnetic field strength or temperature.

It is possible that the RFID tag contains more than one transponder chip.

The computer system can be a distributed one and/or can utilize the computer resources of the RFID interrogator. In addition the computer system can control the operation of said interrogator.

The system contains the power switching device which device controls the state of the modulators. And the computer system synchronizes operations of the power switching device and the interrogator.

The interrogator is capable of reading the RFID tag near any port of said group of ports before or after the connection of the plug by the use of a interrogator antennas.

In addition the modulator does not contain the RFID tag which interacts with the RFID tag of plug.

BRIEF DESCRIPTION OF THE DRAWINGS

Throughout all drawings, the same reference numerals relate to the same or identical elements.

DETAILED DESCRIPTION OF THE INVENTION

Figure 1:
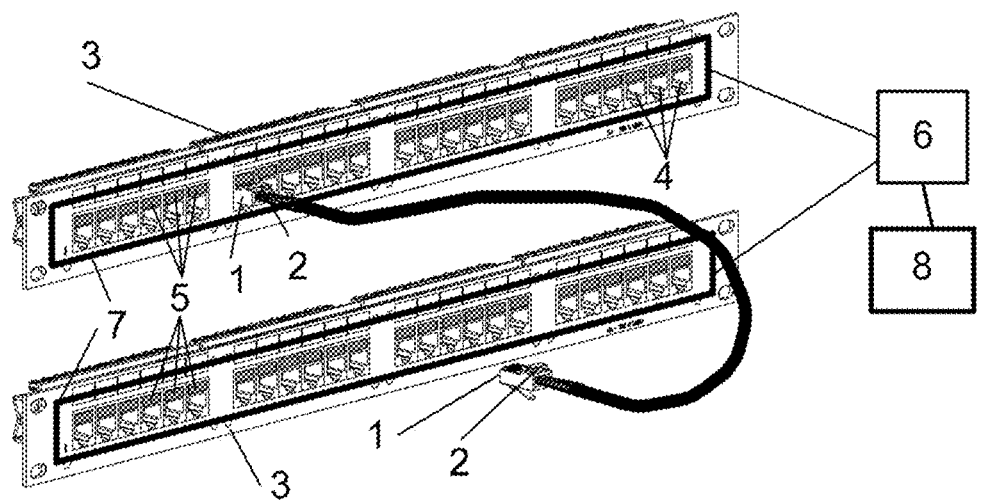
FIG. 1 depicts the general block diagram of the system for monitoring detachable connections.

The system according to the present invention can be implemented in several similar embodiments that are, nevertheless, implemented in the same way that is presented in FIG. 1. Detachable connections of patch panels in FIG. 1 is shown as an example. However the system can be used for monitoring of other connections, for instance, pneumatic or hydraulic ones. The plug 1 is a part of the patch cord. The plug 1 is supplied with the sensor which contains the RFID tag 2. The plug is used for connecting to the patch panel 3 that has connecting ports 4. Thus the result of connecting the patch cord to the patch panel is the detachable connection which consists of two part: the port 4 and the plug 1. The system has the RFID interrogator 6 which has two near field antennas. Each antenna processes a group of ports 4. In our case the group of ports 4 coincides with all port of one patch panel. However the antenna 7 can process only part of ports 4 of the patch panel 3 or covers two panels at ones. It depends on the radio channel properties of the RFID interrogator 6. On other hand the antennas 7 can be far-field antennas not near-field ones.

The computer system 8 with a proper software is connected to the interrogator through, for example, LIN or CAN buses. The computer system 8 is used to process information from the interrogator 6. The units presented in FIG. 1 are rather functional units than physical ones. Thus the unit 6 reads information from the RFID tags 2. The unit 8 processes the information. In practice the interrogator gets identifies from RFID tags and transmits them to the computer 8. The computer processes the information. However modern RFID interrogators (for example, Symbol XR480) has enough computer power to identify parts of the connection themselves immediately after an RFID tags 2 interrogation. Thus units 6 and 8 can be one physical unit. On other hand functions of unit 6 and 8 can be distributed among physical devices in different ways.

Every port 4 has the modulator which changes the replay signal of the RFID tag 2 after connecting of a plug to the port 4. And the changing is unique in the group of ports covered by the antenna 7 (all ports of the patch panel in this case).

Figure 2:
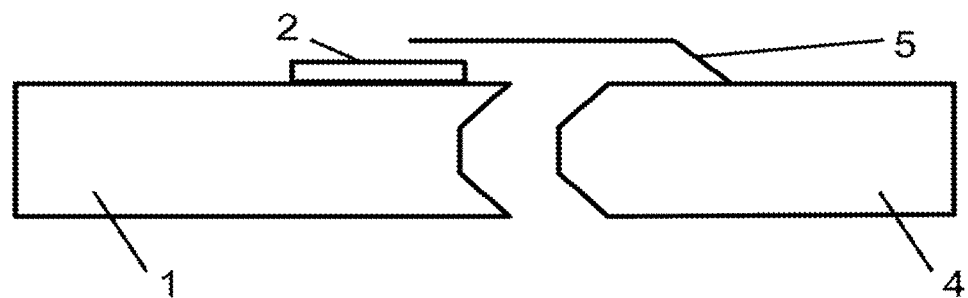
FIG. 2 shows an example of the system that uses variable levels of the RFID tag reply signal.

Possible design of sensors according the present invention is presented in FIG. 2 (side view). The plug and port here are an 110-style patch panel connection hardware that has flat design. The standard EPC Gen2 Avery AD811 RFID tag can be used. The modulator in FIG. 2 is a metallic screen 5 mounted at the port 4. When the plug 1 is connected to the port 4 the screen 5 shadows partly the antenna of the RFID tag 2. At the same time the level of the reply signal is changed. The level of reply signal can be measured by RSSI (Received Signal Strength Indication that is supported by RFID interrogators based on Intel R1000 chips as well as Symbol XR480). The more the area of screen 5 the less RSSI of the tag. Thus changing the area of the screen we can get different RSSI for each port 4. The received RSSI can be corresponded uniquely to each port 4 in the computer system 8 as well as the RFID tags 2 identifiers can be corresponded to plugs 1. When the plug 1 is connected to a port 4 interrogator 6 reads the unique identifier of RFID tag 2. It allows to identify the plug. At the same time the interrogator receives the value of RSSI. The computer system 8 identifies the port 4 using of the received RSSI.

Figure 3:
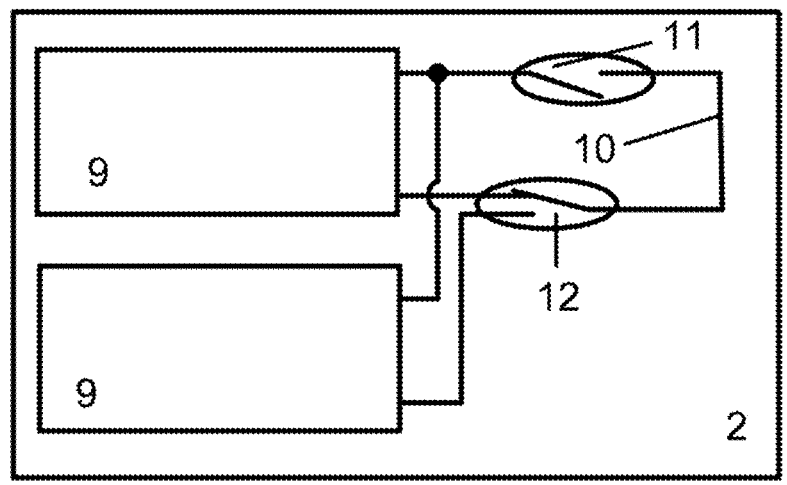
FIG. 3 gives an example of implementation of the connection sensor based on the RFID tag with several transponder chips.

Another implementation is based on the RFID tag presented in FIG. 3. The near-field tag 2 contains several (two in the FIG. 3) transponder chips 9. The chips are connected to the magnetic (loop) antenna 10 through impedance matching elements in general. The antenna 10 is connected to chips 9 through dry reed switches 11 (normally opened) and 12 (single-pole double throw). In this case the modulators in FIG. 1 are permanent magnets or electromagnets. They produce different magnetic field strength (magnetizing force) near each port of the group. For example, the first port at the left of the patch panel 3 has a less power magnet then the second one. The dry reed switches 11 and 12 have the sensitivity that the magnet of the first port can close the reed switch 11 but can not close the switch 12. The magnet of the second port can close both switch. Until the plug 1 is connected to the first or the second port the switch 11 opens the antenna. The tag 2 can not be read by the interrogator 6. If plug 1 is connected to the first port the switch 11 is closed but the switch 12 is not activated. Thus the antenna is connected to the top chip 9 in FIG. 3. The tag 2 transmits the identifier stored in the top chip 9. When the plug 1 is connected to the second port of the panel with the more power magnet the switch 12 connects the lower chip 9 to the antenna disconnecting the top chip. The identifier of the lower chip 9 is transmitted. Thus the first identifier corresponds to the first port and the second identifier corresponds to the second port. At the same time the both identifiers belong to the plug 1. The task of identification is solved.

Another variant of the invention may contain an active RFID tag which design is based on the chip with a temperature sensor, for example, the chip IDS-SL13A produced by IDS Microchip AG. In this case modulators 5 in FIG. 1 may be resistors with different temperature values mounted near ports 4. Each port has a unique temperature that stored in the computer system 8. If the resistors with different value of resistance are supplied by the same voltage they have different temperature. After connecting the plug 1 to a port 4 the tag 2 is heated to the temperature which is close to the temperature of the corresponding resistor. The temperature sensor built-in the tag 2 writes the temperature value in the tag memory. This value can be read by the interrogator 6. When the temperature of the tag 2 is known the port 4 can be identified. Reading the identifier of the tag 2 the plug can be identified also.

Figure 4:
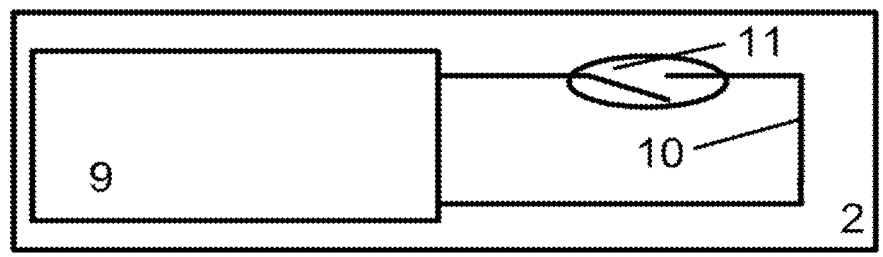
FIG. 4 shows an example of implementation of the connection sensor based on RFID tag with a dry reed switch.

The next variant of the invention uses the RFID tag presented in FIG. 4. The tag consists of the chip of transponder 9, the magnetic (loop) antenna 10 and the dry reed switch 11. Electromagnets located near ports 4 is used as modulators 5 in FIG. 1. Power is supplied to each electromagnet separately by computer system 8. Until the plug 1 is connected to a port 4 the dry reed switch is open. Thus the tag 2 is unreadable. After connecting of the plug 1 to a port 4 the power can be supplied to the electromagnets by turn switching on and off each electromagnet. At the same time the interrogator polls the RFID tags. When an electromagnet is power supplied and the corresponding port is occupied by a plug the dry reed switch 11 is closed. Thus the identifier of the tag 2 can be read by the interrogator 6. The moment of the tag reading correlates with the moment of power suppling to the electromagnet of the specific port 4 when the plug 1 is connected.

There is more convenient way when the computer system has a special switching device. The device supplies power transiently to each electromagnet from a group of ports 4 in turn. When we known that the power is supplied to the specific modulator 5 of the port 4 we can detect presence a plug in the port as well as identify the plug using the identifier of the tag that is read at the same time. A modern interrogator can reads more than hundred tags in a second. Thus it needs less than five millisecond to process the information of one port of 24-ports patch panel. A flat power switching device can be mounted over the faceplate of the panel. It includes electromagnets as modulators for each port of the patch panel. The device supplies power subsequently to each electromagnet-modulator for five millisecond. It does it periodically, for example, every 150 millisecond by a clock signal. The clock signal is fed by the computer system 8 to the interrogator 6 as well. There is a way when the interrogator is the computer system at the same time, for example, Symbol XR480. The last can feed the clock signal to the switching device using GPIO ports. Thus the system produces every 150 milliseconds the connection map of the patch panel where the switching device and the antenna 7 is mounted.

The antenna 7 can be located in the same case with the switching device.

The dry reed switch can be normal closed. In this case the interrogator 6 checks not "appearance" but "disappearance" of the tags 2. The dry reed switch can be not hermetically sealed but simple contacts controlled by magnet fields.

The invention claimed is:
1. System for monitoring detachable connections using RFID tags, which system comprising:
   a plug provided with a connection sensor comprising a RFID tag which plug is the first part of a detachable connection;
   a group of ports consisting of at least two ports which ports is the second part of detachable connections where said plug is connected to;
   at least one RFID interrogator;

the computer system which processes the information received from said interrogator identifying each part of a detachable connection;

characterized in that each port of said group of ports has a modulator which changes the reply signal of said RFID tag perceived by said interrogator in an unique manner for each port of said group of ports after connecting said plug to any port of said group of ports;

the reply signal of said RFID tag perceived by said interrogator is changed by said modulator;

the said computer system identifies each part of the detachable connection using the reply signal of said RFID tag changed by said modulator.

2. The system according to claim 1, characterized in that said modulator changes the RSSI of the reply signal of said RFID tag.

3. The system according to claim 1, characterized in that said modulator changes the reply signal of said RFID using screening.

4. The system according to claim 1, characterized in that said modulator changes the identifier transmitted by said RFID tag.

5. The system according to claim 1, characterized in that said modulator changes the memory content of said RFID tag perceived by said interrogator.

6. The system according to claim 1, characterized in that said modulator changes the reply signal of said RFID tag in the time interval corresponded by said computer system with the port provided with said modulator.

7. The system according to claim 1, characterized in that said modulator makes said RFID tag available or unavailable to read by said interrogator.

8. The system according to claim 1, characterized in that said computer system controls states of said modulators.

9. The system according to claim 1, characterized in that said RFID tag contains one or several switches controlled by magnetic field.

10. The system according to any claims 7-9, characterized in that said modulator is a electromagnet and said computer system changes the power supply of said electromagnet.

11. The system according to claim 1, characterized in that said modulator changes a physical property of the environment near the port where said modulator is mounted and said changing is unique within said group of ports.

12. The system according to claim 11, characterized in that said physical property of the environment is magnetic field strength or temperature.

13. The system according to claim 1, characterized in that said RFID tag contains more than one transponder chip.

14. The system according to claim 1, characterized in that said computer system is a distributed one.

15. The system according to claim 1, characterized in that said computer system uses the computer resources of said interrogator.

16. The system according to claim 1, characterized in that said computer system controls the operation of said interrogator.

17. The system according to claim 1, characterized in that contains the power switching device which device controls the state of said modulator.

18. The system according to claim 17, characterized in that said computer system synchronizes operations of said power switching device and said interrogator.

19. The system according to claim 1, characterized in that said interrogator is capable of reading said RFID tag near any port of said group of ports before or after the connection of said plug by the use of one of said interrogator antennas.

20. The system according to claim 1, characterized in that said modulator does not contains the RFID tag which interacts with said RFID tag of plug.

* * * * *